United States Patent
Kura

(10) Patent No.: US 8,584,330 B2
(45) Date of Patent: Nov. 19, 2013

(54) METHOD FOR MANUFACTURING A PIEZOELECTRIC ACTUATOR

(75) Inventor: Keiji Kura, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 286 days.

(21) Appl. No.: 12/882,582

(22) Filed: Sep. 15, 2010

(65) Prior Publication Data

US 2011/0074252 A1 Mar. 31, 2011

(30) Foreign Application Priority Data

Sep. 30, 2009 (JP) ................................. 2009-227933

(51) Int. Cl.
*H04R 17/10* (2006.01)

(52) U.S. Cl.
USPC ............ 29/25.35; 29/846; 310/324; 310/363; 310/366

(58) Field of Classification Search
USPC .............. 29/25.35, 890.1, 842, 846; 310/324, 310/358, 363, 364, 366
See application file for complete search history.

(56) References Cited

U.S. PATENT DOCUMENTS

| | | | |
|---|---|---|---|
| 6,639,340 B1 | 10/2003 | Qiu et al. | |
| 6,774,541 B1 * | 8/2004 | Fukui | 310/358 |
| 7,240,410 B2 * | 7/2007 | Yamada et al. | 29/25.35 |
| 7,771,780 B2 | 8/2010 | Yasui et al. | |
| 8,220,905 B2 | 7/2012 | Sugahara | |
| 2006/0012644 A1 | 1/2006 | Yasui | |
| 2006/0012646 A1 | 1/2006 | Yasui | |
| 2007/0046156 A1 * | 3/2007 | Yasui et al. | 310/363 |
| 2007/0130740 A1 * | 6/2007 | Mita | 29/25.35 |
| 2008/0049077 A1 | 2/2008 | Sugahara | |
| 2009/0219346 A1 | 9/2009 | Suzuki | |

FOREIGN PATENT DOCUMENTS

| | | |
|---|---|---|
| JP | 06297720 A * | 10/1994 |
| JP | 2000-357826 A | 12/2000 |
| JP | 2006-51812 | 2/2006 |
| JP | 2007-88449 A | 4/2007 |
| JP | 2007-283729 A | 11/2007 |
| JP | 2008-74091 A | 4/2008 |
| JP | 2009-202508 | 9/2009 |

OTHER PUBLICATIONS

Notice of Reasons for Rejection dated Sep. 24, 2013 from related JP 2009-227933 together with partial English translation.

* cited by examiner

*Primary Examiner* — A. Dexter Tugbang
(74) *Attorney, Agent, or Firm* — Scully, Scott, Murphy & Presser, PC

(57) ABSTRACT

A method for manufacturing a piezoelectric actuator is provided. The method includes: forming a diffusion-preventive layer having an electrical conductivity on a partial surface thereof on a surface of a vibration plate formed of a metallic material; forming a piezoelectric layer on the surfaces of the diffusion-preventive layer and the vibration plate; forming an electrode in an area of the piezoelectric layer which overlaps the partial surface of the diffusion-preventive layer having the electrical conductivity; forming an extraction electrode in an area of the piezoelectric layer which does not overlap the diffusion-preventive layer; and heating the piezoelectric layer and the vibration plate after the piezoelectric layer is formed so as to diffuse metallic atoms of the metallic material of which the vibration plate is formed to the piezoelectric layer, thereby making the extraction electrode be in conduction with the partial surface of the diffusion-preventive layer having the electrical conductivity.

13 Claims, 9 Drawing Sheets

METHOD FOR MANUFACTURING A PIEZOELECTRIC ACTUATOR

CROSS REFERENCE TO RELATED APPLICATION

The present application claims priority from Japanese Patent Application No. 2009-227933, filed on Sep. 30, 2009, the disclosure of which is incorporated herein by reference in its entirety.

BACKGROUND OF THE INVENTION

1. Field of the Invention

The present invention relates to a method for manufacturing piezoelectric actuators and to a piezoelectric actuator.

2. Description of the Related Art

Conventionally, in various technical fields, a piezoelectric actuator has been utilized which drive an object by utilizing deformation of a piezoelectric layer (piezoelectric distortion) when an electrical field acts on the piezoelectric layer. Such a piezoelectric actuator has a piezoelectric layer and two electrodes which sandwich the piezoelectric layer. When a voltage is applied to the two electrodes, an electrical field acts on an active portion of the piezoelectric layer sandwiched by the two electrodes, thereby deforming the active portion.

Accordingly, in order to apply a voltage to the two electrodes which sandwich the piezoelectric layer, it is necessary to electrically connect the two electrodes with a drive portion such as a driver IC and the like. Then, in order to electrically connect the two electrodes with the drive portion, it is conceivable, for example, to connect a flexible wiring substrate provided with the driver IC to the upper surface of the piezoelectric actuator. In this case, it is necessary to extract wirings from the two electrodes to the surface of the piezoelectric actuator.

As an example, a piezoelectric actuator is known in which extraction electrodes on the surface of the piezoelectric actuator are connected, via through holes, to the inner electrodes arranged inside the piezoelectric layer and thus not exposed to the surface of the piezoelectric layer. For example, in a certain piezoelectric actuator, two piezoelectric layers are stacked on the upper surface of a vibration plate; and an lower constant-voltage electrode, an upper constant-voltage electrode, and individual electrodes are arranged respectively on the upper surface of the vibration plate, the upper surface of the under piezoelectric layer, and the upper surface of the upper piezoelectric layer. Then, the upper surface of the upper piezoelectric layer is exposed as the surface of the piezoelectric actuator, and in addition to the individual electrodes, a first surface electrode and a second surface electrode are arranged on the upper surface of the upper piezoelectric layer. Although the upper constant-voltage electrode and the lower constant-voltage electrode are not exposed to the surface of the piezoelectric actuator, the upper constant-voltage electrode and the lower constant-voltage electrode are electrically connected with the first surface electrode and the second surface electrode via through holes formed in the piezoelectric layers.

SUMMARY OF THE INVENTION

However, for the piezoelectric actuator described above, in the manufacturing processes, it is necessary to have a process of forming through holes penetrating the piezoelectric layers in the thickness direction, and a process of filling a conductor such as a metallic material and the like into the through holes, thereby complicating the manufacturing processes. Further, because the metallic material is necessary for filling the through holes, the cost goes up. Further, if the through holes is not sufficiently filled with the metallic material, ineffective conduction may be brought about, thereby resulting in a low reliability of conduction.

Accordingly, an object of the present invention is to provide a method for manufacturing a piezoelectric actuator and the piezoelectric actuator, in which the reliability of the conduction between a first electrode and an extraction electrode is improved, the manufacturing processes are simplified, and the cost is reduced.

According to a first aspect of the present invention, there is provided a method for manufacturing a piezoelectric actuator, including: preparing a vibration plate formed of a metal;

forming a diffusion-preventive layer on a surface of the vibration plate, a part of a surface of the diffusion-preventive layer not facing the vibration plate having an electrical conductivity;

forming a piezoelectric layer in a first area, of the surface of the vibration plate, in which the diffusion-preventive layer is formed and in a second area, of the surface of the vibration plate, in which the diffusion-preventive layer is not formed;

forming an electrode in a third area, of a surface of the piezoelectric layer not facing the vibration plate, which overlaps with the part of the surface of the diffusion-preventive layer;

forming an extraction electrode in a forth area, of the surface of the piezoelectric layer, which does not overlap with the diffusion-preventive layer; and heating the piezoelectric layer and the vibration plate so as to diffuse metallic atoms in the vibration plate to the piezoelectric layer, after the piezoelectric layer is formed, wherein in the heating of the piezoelectric layer and the vibration plate, the metallic atoms in the vibration plate are diffused to the piezoelectric layer such that a portion of the surface of the piezoelectric layer, which is located in the forth area and which is in contact with the vibration plate is electrically conducted with the surface of the vibration plate so as to make the part of the surface of the diffusion-preventive layer be in conduction with the extraction electrode.

According to the method for manufacturing a piezoelectric actuator of the present invention, the area of the piezoelectric layer sandwiched by the electrode and the partial surface of the diffusion-preventive layer having the electrical conductivity becomes an active portion which piezoelectrically deforms due to exposure to an electrical field produced by a voltage applied to the area. The partial surface of the diffusion-preventive layer having the electrical conductivity is, herein, referred to as a first electrode because it functions as an electrode. The first electrode may be the surface of a metallic diffusion-preventive layer, and may also be a conductive thin film formed on a surface of a diffusion-preventive film formed of an insulation material such as ceramics and the like. Hence, it is necessary for the area as an active portion of the piezoelectric layer to maintain insulating property and piezoelectric property. In heating the piezoelectric layer and the vibration plate, the metallic atoms of the vibration plate diffuse to the piezoelectric layer in the area which does not overlap the diffusion-preventive layer. Therefore, the conductivity is increased in the area of the piezoelectric layer which does not overlap with the diffusion-preventive layer, and thereby the piezoelectric layer becomes conductive in that area between the surface in contact with the vibration plate and the surface on the opposite side of the vibration plate. Thereby, it is possible to make the first electrode be in conduction with the extraction electrode via the high-conductive area of the piezoelectric layer with the increased conductivity.

Therefore, it is not necessary to have a process of forming a through hole in the piezoelectric layer in order to extract the first electrode, to the top surface of the piezoelectric actuator, which is provided on the surface, of the piezoelectric layer, on a side of the diffusion-preventive layer. Thus, only the heating process is carried out to merely heat the piezoelectric layer and the vibration plate, and thereby it is possible to simplify the manufacturing processes. Further, metallic materials are usually utilized as a conductor with which the through hole is filled. However, since it is not necessary to have the process of forming the through hole, the metallic materials for filling the through-hole are no longer needed. Thereby, it is possible to reduce the cost.

According to a second aspect of the present invention, there is provided a piezoelectric actuator including: a vibration plate made of a metal;

a piezoelectric layer which has an active portion and which is arranged on a surface of the vibration plate;

a diffusion-preventive layer arranged between the vibration plate and the piezoelectric layer at an area which overlaps with the active portion;

a first electrode arranged to cover both a surface of the diffusion-preventive layer facing the piezoelectric layer and the surface of the vibration plate;

a second electrode arranged on a surface of the piezoelectric layer not facing the vibration plate at an area which overlaps with an area, of the first electrode, formed on the diffusion-preventive layer; and an extraction electrode arranged on the surface of the piezoelectric layer not facing the vibration plate at an area which does not overlap with the diffusion-preventive layer, wherein the area of the piezoelectric layer which does not overlap with the diffusion-preventive layer, to which metallic atoms of the vibration plate diffuses, is a high-conductive area higher in electrical conductivity than the active portion of the piezoelectric layer.

According to the piezoelectric actuator of the present invention, in comparison with the case of making the first electrode be in conduction with the extraction electrode via a through hole, for example, because it is not necessary to prepare a metallic material utilized as a conductor for filling the through hole, it is possible to reduce the cost.

BRIEF DESCRIPTION OF THE DRAWINGS

FIG. 5A shows a process of forming a diffusion-preventive layer; FIG. 5B shows a process of forming a common electrode; FIG. 5C shows a process of forming a piezoelectric layer; FIG. 5D shows a process of annealing; and FIG. 5E shows a process of forming an individual electrode and extraction electrode;

FIG. 9A is a partial enlarged plan view of the ink-jethead; and FIG. 9B is a cross-sectional view taken along the IXB-IXB line of FIG. 9A.

DESCRIPTION OF THE PREFERRED EMBODIMENTS

First Embodiment

Figure 1:
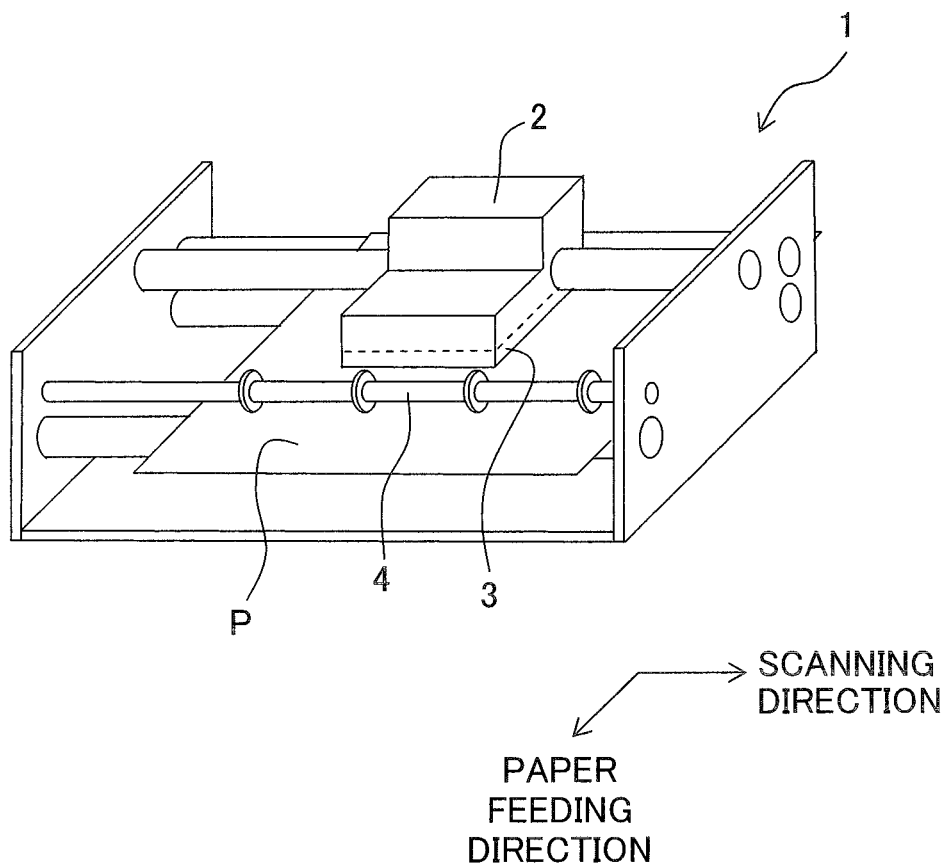
FIG. 1 is a schematic configuration diagram of a printer in relation to first and second embodiments of the present invention.

Hereinbelow, explanations will be made with respect to a first embodiment of the present teaching. As shown in FIG. 1, a printer 1 includes a carriage 2, an ink-jethead 3, a paper transport roller 4, and the like.

The carriage 2 moves in a reciprocating manner in a left-right direction in FIG. 1 (scanning direction). The ink-jet head 3 is arranged on the lower surface of the carriage 2, and discharges ink from nozzles 15 (see FIG. 4) formed on the lower surface while moving in a reciprocating manner in the scanning direction together with the carriage 2. The paper transport roller 4 transports the recording paper P in a frontward direction of FIG. 1 (paper feeding direction). Then, the printer 1 carries out a printing on the recording paper P by discharging ink from the ink-jethead 3, upon moving in a reciprocating manner in the scanning direction together with the carriage 2, to the recording paper P transported by the paper transport roller 4 in the paper feeding direction. Further, after the printing is finished, the recording paper P is discharged by the paper transport roller 4.

Figure 2:
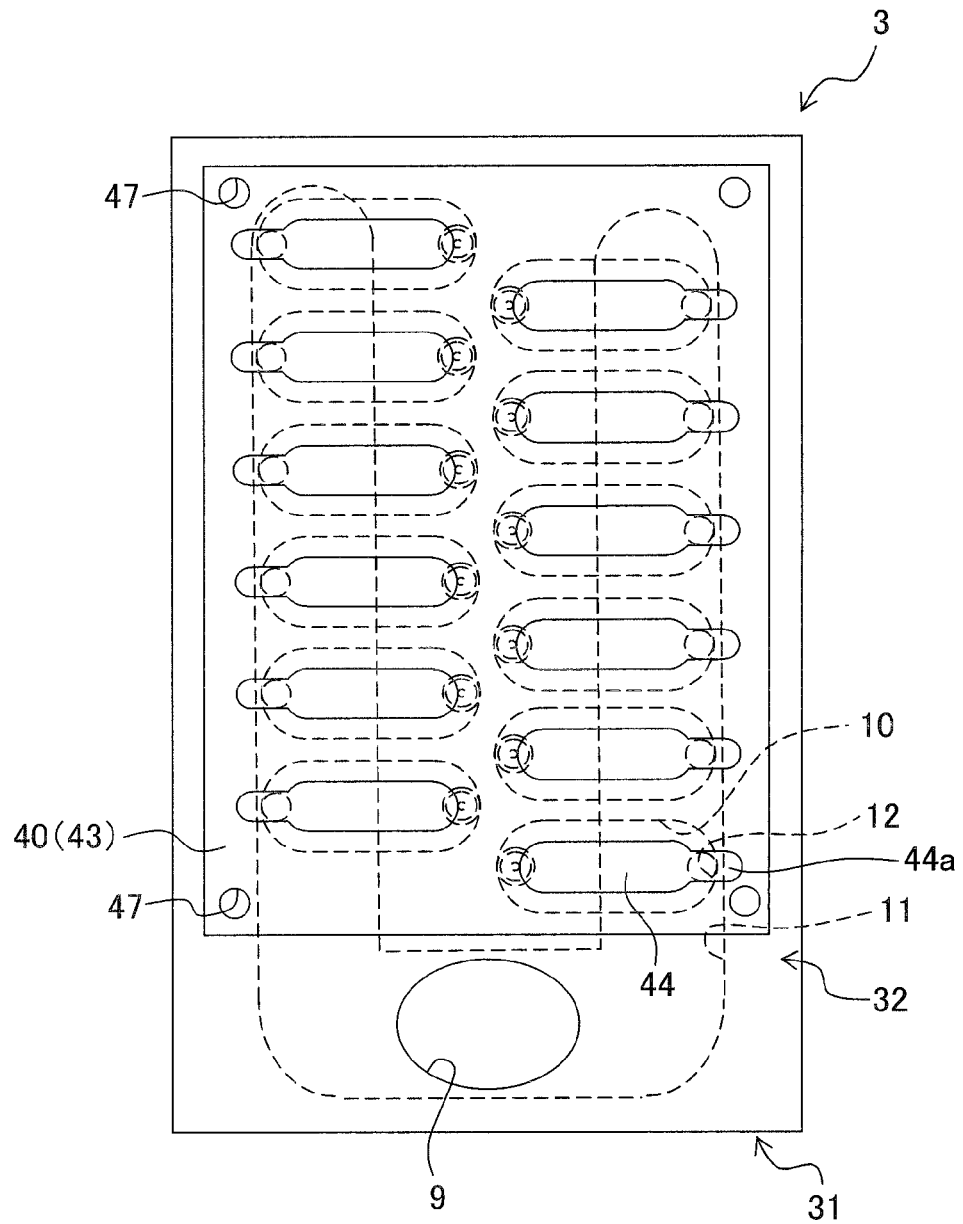
FIG. 2 is a plan view of an ink-jethead of the printer of FIG. 1.
Figure 3:
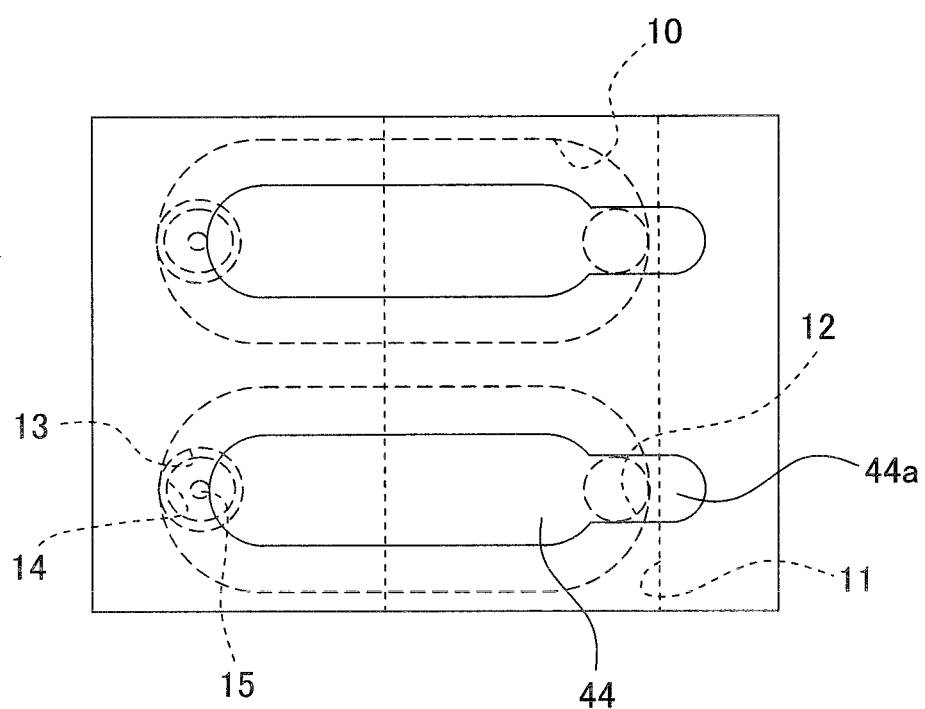
FIG. 3 is a partial enlarged view of FIG. 2.
Figure 4:
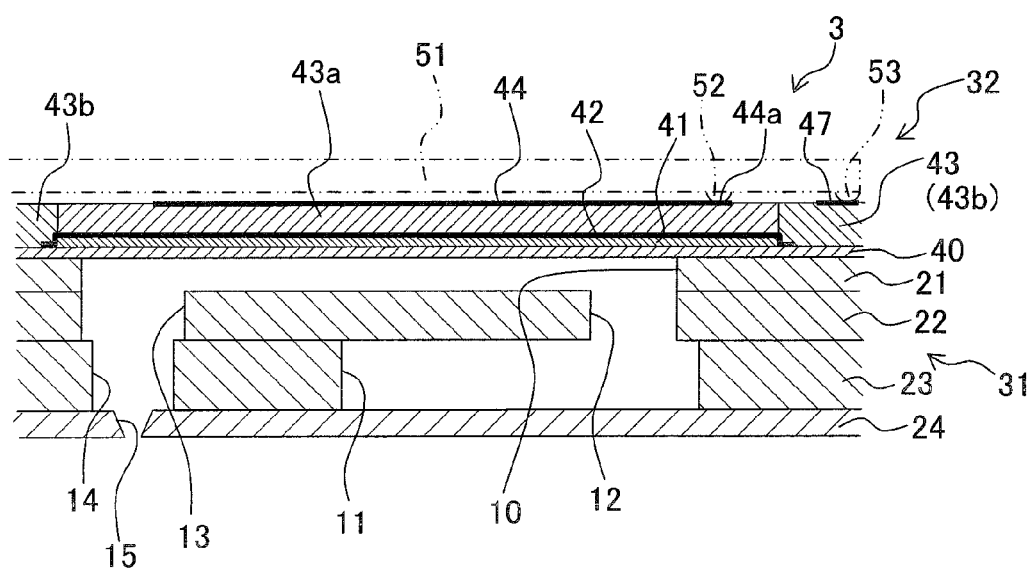
FIG. 4 is a longitudinal sectional view of the ink-jethead.

Next, the ink-jethead 3 will be described. As shown in FIGS. 2 to 4, the ink jet head 3 has a channel unit 31 in which ink channels are formed of a plurality of pressure chambers 10 and the like, and a piezoelectric actuator 32 which is arranged on the upper surface of the channel unit 31 and utilized for applying a pressure to the ink in the pressure chambers 10.

First, the channel unit 31 will be described. The channel unit 31 has four plates including a cavity plate 21, a base plate 22, a manifold plate 23, and a nozzle plate 24, the plates being stacked in this order from the top. Except the nozzle plate 24, the three plates 21 to 23 are formed of a metallic material such as stainless steels and the like, whereas the nozzle plate 24 is formed of a synthetic-resin material such as polyimide and the like. In addition, in the same manner as the other three plates 21 to 23, the nozzle plate 24 may also be formed of a metallic material.

In cavity plate 21, the plurality of pressure chambers 10 are formed. The pressure chambers 10 have an approximate ellipse shape, in a planner view, which is elongated in the scanning direction (left-right direction of FIG. 2). The pressure chambers 10 are arranged in the paper feeding direction (up-down direction) to form two rows arranged side by side in the scanning direction. The through holes 12 and 13 are formed in the areas, of the base plate 22, which respectively overlap the two longitudinal ends of the pressure chambers 10 in a plane view.

In the manifold plate 23, a manifold channel 11 is formed which extends in two rows in the paper feeding direction. One row of the manifold channel 11 overlaps the approximate left half portions of the pressure chambers 10 aligned on the left side in FIG. 2 in a plane view, and the other row of the manifold channel 11 overlaps the approximate right half portions of the pressure chambers 10 aligned on the right side in FIG. 2. The ink is supplied from an ink supply port 9 to the manifold channel 11. Further, through holes 14 are formed in the areas, of the manifold plate 23, which overlap the through holes 13 in a plane view, respectively.

The nozzles 15 are formed in the nozzle plate 24 at the positions which overlap the through holes 14, respectively. Then, in the channel unit 31, the manifold channel 11 is in communication with the pressure chambers 10 via the through holes 12, and the pressure chambers 10 are in communication with the nozzles 15 via the through holes 13 and 14. That is, in the channel unit 31, a plurality of individual ink channels, which extends from the exits of the manifold channel 11 through the pressure chambers 10 to the nozzles 15, are formed.

Next, the piezoelectric actuator 32 will be described. The piezoelectric actuator 32 is arranged on the upper surface of the channel unit 31 (cavity plate 21) to cover the pressure chambers 10. The piezoelectric actuator 32 includes a vibration plate 40, a diffusion-preventive layer (diffusion barrier layer) 41, a common electrode 42 (first electrode), and a piezoelectric layer 43 which are stacked in the sequence from the bottom, and further has a plurality of individual electrodes 44 (second electrode) and extraction electrodes 47 arranged on the upper surface of the piezoelectric layer 43.

The vibration plate 40 is an approximately rectangular plate member formed of a metallic material such as stainless steels in the same manner as the plates 21 to 23. The vibration plate 40 is joined together with the upper surface of the cavity plate 21 so as to cover the pressure chambers 10.

Figure 6:
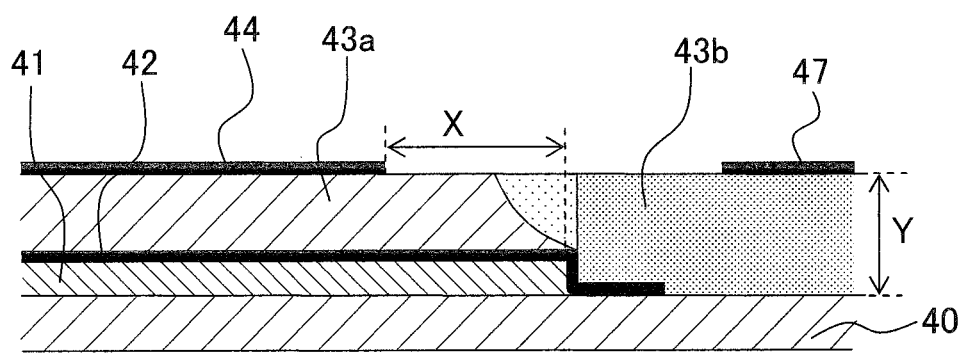
FIG. 6 is a partial enlarged view of FIG. 5E.

The diffusion-preventive layer 41 is formed of ceramics such as alumina, zirconia, and the like. The diffusion-preventive layer 41 is formed on the upper surface of the vibration plate 40 in an area which overlaps the pressure chambers 10 of the channel unit 31, in a plane view. Further, as shown in FIG. 6, the distance X, in a plane direction, from an outer edge of the diffusion-preventive layer 41 to an edge portion of the area of the piezoelectric layer 43 sandwiched by the individual electrodes 44 and the common electrode 42 (the active portion) is longer than the thickness Y of the piezoelectric layer 43. The diffusion-preventive layer 41 prevents the metallic atoms of the vibration plate 40 from diffusing to the piezoelectric layer 43 due to the heating of the vibration plate 40 in an annealing process which will be described hereinafter.

As shown in FIGS. 2 to 4, the common electrode 42 is made of a conductive material such as platinum, palladium, gold, silver, and the like, and formed to cover the entire area on the upper surface of the diffusion-preventive layer 41 and, further, is formed, beyond the outer edges of the diffusion-preventive layer 41, to cover the upper surface of the vibration plate 40. Thereby, the common electrode 42 is in conduction with the vibration plate 40.

The piezoelectric layer 43 is made of a piezoelectric material composed mainly of lead zirconate titanate which is a mixed crystal of lead titanate and lead zirconate. The piezoelectric layer 43 is formed to cover the entire area on the upper surface of the common electrode 42, and to cover the entire area on the upper surface of the vibration plate 40 on which the diffusion-preventive layer 41 is not formed. Further, the area, of the piezoelectric layer 43, which overlaps the diffusion-preventive layer 41 in a plane view is a dielectric area 43a, and the area which does not overlap the diffusion-preventive layer 41 is a high-conductive area 43b which is formed with the metallic atoms diffused thereinto from the vibration plate 40 and thus has a higher electrical conductivity than the dielectric area 43a.

The surface, of the high-conductive area 43b in the piezoelectric layer 43, which is in contact with the vibration plate 40 is electrically conducted with the other surface, of the high-conductive area 43b in the piezoelectric layer 43, which is in contact with the extraction electrodes 47. Thereby, the vibration plate 40 is in conduction with the extraction electrodes 47 via the high-conductive area 43b of the piezoelectric layer 43. Further, since the common electrode 42 is in conduction with the vibration plate 40, the common electrode 42 is thus in conduction with the extraction electrodes 47. Further, because the common electrode 42 is in conduction with the high-conductive area 43b of the piezoelectric layer 43, the common electrode 42 is in conduction with the extraction electrodes 47, regardless of conductivity with the vibration plate 40. Further, the active portion which is sandwiched by the individual electrodes 44 and the common electrode 42 and which is a part of the dielectric area 43a of the piezoelectric layer 43 is previously polarized in the thickness direction.

The individual electrodes 44 are formed of a conductive material such as platinum, palladium, gold, silver, and the like, in the same manner as the common electrode 42, and are arranged on the upper surface of the dielectric area 43a of the piezoelectric layer 43 corresponding to the pressure chambers 10. Each of the individual electrodes 44 has an approximate ellipse shape which is sufficiently smaller than the pressure chambers 10. The individual electrodes are arranged on the upper surface of the piezoelectric layer 43 at an area which overlaps with a portion, of the common electrode 42, formed on the diffusion-preventive layer 41 and which overlaps the approximate center portion of the pressure chambers 10, in a plane view. The end portion of the individual electrodes 44 on the opposite side of the nozzles 15 in the longitudinal direction extends on to the area, of the piezoelectric layer 43, which does not overlap with the pressure chambers 10, and its tip forms a contact point 44a, respectively. A flexible print circuit (FPC) 51 is connected to the contact points 44a for the connection with a driver IC (not shown) which applies a drive potential to the individual electrodes 44. Then, by means of the driver IC, the drive potential is applied to the individual electrodes 44 via the lands 52 of the FPC 51.

The extraction electrodes 47 are formed of a conductive material such as platinum, palladium, gold, silver, and the like, in the same manner as the common electrode 42 and the individual electrodes 44, and are arranged on the upper surface, of the high-conductive area 43b of the piezoelectric layer 43, at areas which neither overlap the diffusion-preventive layer 41 nor overlap the common electrode 42, in a plane view. Further, the extraction electrodes 47 are formed in a circular pattern in a plane view, and are arranged in the four corners of the piezoelectric layer 43. The extraction electrodes 47 are in conduction with the vibration plate 40 and the common electrode 42 via the high-conductive area 43b of the piezoelectric layer 43. The extraction electrodes 47 are connected to the FPC 51 and kept at the ground potential via the lands 53 of the FPC 51 from the driver IC. Hence, the common electrode 42 is kept at the ground potential via the extraction electrodes 47, the high-conductive area 43b of the piezoelectric layer 43, and the vibration plate 40. Further, because the individual electrodes 44 and the extraction electrodes 47 are formed on the same surface of the piezoelectric layer 43, these electrodes are pressed with an equal loading when the FPC 51 is conjoined by hot press. Therefore, it is possible to connect these electrodes with the FPC 51 surely.

Next, an explanation will be made with respect to a method of driving the piezoelectric actuator 32. When the piezoelectric actuator 32 is driven, the driver IC applies the drive potential to the individual electrodes 44. As a result, a potential difference occurs between the individual electrodes 44 to which the drive potential is applied and the common electrode 42 kept at the ground potential. Thereby, an electrical field in the thickness direction is produced in the active portions of the piezoelectric layer 43 sandwiched by the individual electrodes 44 and the common electrode 42. Since the direction of the electrical field is parallel to the polarization direction of the active portion of the piezoelectric layer 43, the active portion of the piezoelectric layer 43 contracts in a horizontal direction which is perpendicular to the polarization direction (piezoelectric lateral effect). By virtue of this contraction of the piezoelectric layer 43, the portions of the vibration plate 40, the diffusion-preventive layer 41, the common electrode 42, and the piezoelectric layer 43 which overlap the pressure chamber 10 deform to be convex toward the pressure chamber 10 (unimorph deformation). This deformation causes the decrease of the volume of the pressure chamber 10 and thus causes the increase the pressure of the ink in the pressure chamber 10. Thereby, the ink is discharged from the nozzle 50 in communication with the pressure chamber 10.

Figure 5A:
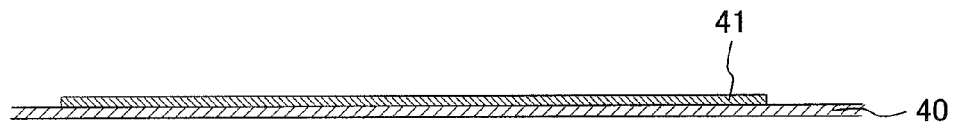
FIGS. 5A to 5E constitute a process chart showing processes of manufacturing a piezoelectric actuator.

Next, explanations will be made with respect to a method for manufacturing the piezoelectric actuator 32. First, as shown in FIG. 5A, the diffusion-preventive layer 41 is formed in a partial area on a surface of the vibration plate 40, according to an aerosol deposition method (AD method), for example, by depositing ceramic particles such as alumina, zirconia, and the like (diffusion-preventive layer formation process). Further, the partial area of the vibration plate 40 includes the area overlapping the pressure chambers 10 of the channel unit 31 in a plane view when the vibration plate 40 and the channel unit 31 are conjoined to form the ink-jet head 3.

Figure 7:
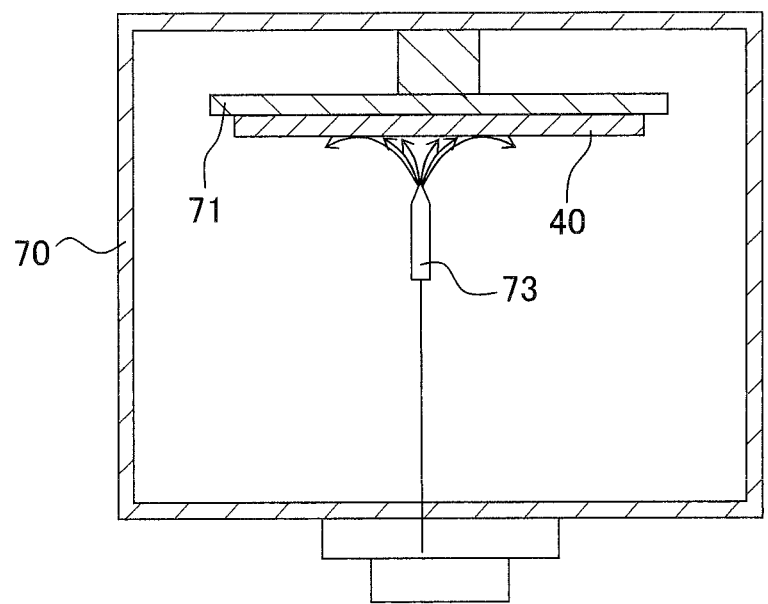
FIG. 7 is a schematic configuration diagram of a chamber inside according to an AD method.

According to the AD method, as shown in FIG. 7, the vibration plate 40 is secured by such as fixing the edge of the vibration plate 40 with a tape to a stage 71 in a chamber 70. Then, the pressure is reduced in the chamber 70. At this time, a pressure difference occurs between the chamber 70 and an aerosol chamber (not shown) in which a mixture (aerosol) of particles of the ceramics composing the diffusion-preventive layer 41 and a gas (carrier gas) is enclosed or sealed. The AD method is a film formation method which utilizes this pressure difference to spray the aerosol onto the vibration plate 40 from a spray nozzle 73 in communication with the aerosol chamber, and thereby to make the particles of alumina and the like collide with the vibration plate 40 at a high speed while depositing the ceramic particles on the vibration plate 40 by moving the stage 71 in a horizontal direction in a reciprocating manner. The method for producing the diffusion-preventive layer is not limited to the AD method, the diffusion-preventive layer 41 may also be formed according to a sputter method, a vapor deposition method, and the like.

Figure 5B:
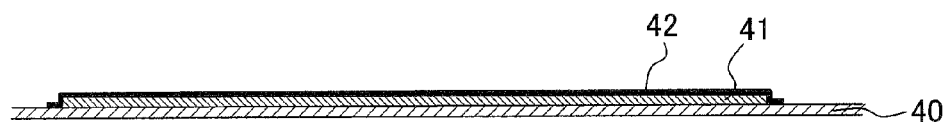
Figure 5C:
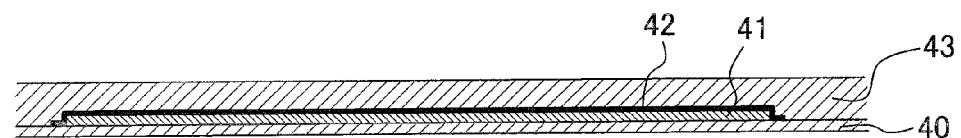

Next, as shown in FIG. 5B, the common electrode 42 is formed, by the sputter method, to cover the entire area on the upper surface of the diffusion-preventive layer 41 (the surface not facing the vibration plate 40) and, further, is formed on the upper surface of the vibration plate 40, beyond the outer edges of the diffusion-preventive layer 41 (common electrode formation process: first electrode formation process). Subsequently, as shown in FIG. 5C, by utilizing the piezoelectric material composed mainly of lead zirconate titanate which is a mixed crystal of lead titanate and lead zirconate, the piezoelectric layer 43 is formed according to the AD method by depositing the particles of the piezoelectric material both on the surface of the common electrode 42 and on the upper surface, of the vibration plate 40, on which the diffusion-preventive layer 41 is not provided (piezoelectric layer forming process).

Figure 5D:
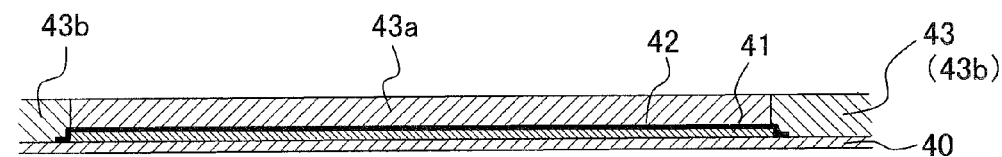

However, when the piezoelectric layer forming process is carried out according to the AD method, the piezoelectric layer 43 is formed by collision of the particles of the piezoelectric material against the upper surfaces of the common electrode 42 and the vibration plate 40 at a high speed. Therefore, particle miniaturization, lattice defect, and the like may occur in the piezoelectric layer 43. Thereby, there is a fear that a necessary piezoelectric property for deforming the vibration plate 40 is not obtained. Therefore, as shown in FIG. 5D, the piezoelectric layer 43 is heated by heating the vibration plate 40, the diffusion-preventive layer 41, the common electrode 42, and the piezoelectric layer 43 to a predetermined temperature (for example, 900° C.: referred to as an anneal temperature hereinafter), in order to repair the lattice defect in the crystal while growing a crystal of the piezoelectric material so as to improve the piezoelectric property (annealing process: heating process). It is necessary to anneal the piezoelectric layer at a temperature of at least approximately 600° C. or higher in order to bring a suitable piezoelectric property to the piezoelectric layer formed according to the AD method; and it is preferable to anneal the piezoelectric layer at a temperature of approximately 850° C. or higher (for example, 850° C. to 900° C.) in order to bring an optimum piezoelectric property to the piezoelectric layer. Further, although there is not a particular upper limit on the anneal temperature, it is desirable to remain within the degree of temperature which does not deteriorate other members.

The diffusion of the metallic atoms of the vibration plate 40 becomes conspicuous at a temperature of approximately 600° C. or higher. Hence, in the annealing process described above, the metallic atoms of the vibration plate 40 diffuse toward the piezoelectric layer 43. At this time, because the diffusion-preventive layer 41 restrains the metallic atoms of the vibration plate 40 from diffusing to the piezoelectric layer 43 formed over the diffusion-preventive layer 41, the piezoelectric layer 43 (dielectric area 43a) does not change in piezoelectric property.

On the other hand, the area, of the piezoelectric layer 43, which is in contact with the vibration plate 40 becomes the high-conductive area 43b to which the metallic atoms of the vibration plate 40 diffuse so that the high-conductive area 43b has a higher electrical conductivity than the dielectric area 43a. This high-conductive area 43b of the piezoelectric layer 43 is in contact with both the vibration plate 40 and the common electrode 42, and thereby electrically in conduction with both of the vibration plate 40 and the common electrode 42. That is, the temperature and time of heating the piezoelectric layer 43 in the annealing process are adjusted such that the area, on the surface of the piezoelectric layer 43, which is in contact with the vibration plate 40 is reliably made to be electrically in conduction with the other surface of the piezoelectric layer 43. It is possible to obtain such a heating temperature and heating time by measuring the electrical resistances of the high-conductive area 43b (the electrical resistance of piezoelectric layer in the thickness direction) before and after the annealing process under various conditions of heating temperature and heating time.

Figure 5E:
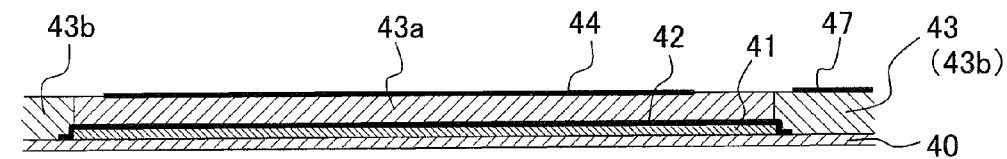

Next, as shown in FIG. 5E, a plurality of individual electrodes 44 are formed on a part of the area of the upper surface of the dielectric area 43a of the piezoelectric layer 43, according to the sputter method, the area overlapping the portion of the common electrode 42 formed on the diffusion-preventive layer 41 in a plane view (individual electrode forming process: second electrode forming process). At this time, the individual electrodes 44 are formed such that the distance between an outer edge of the area, of the individual electrodes 44, in which the individual electrodes 44 overlap the common electrode 42 and an outer edge of the diffusion-preventive layer 41 which is located at the shortest in distance in a plane direction of the piezoelectric layer 43 from the outer edge of the individual electrodes 44 becomes longer than the thickness of the piezoelectric layer 43. Further, at the same time as the second electrode forming process, the extraction electrodes 47 are formed on the area, in the upper surface of the high-conductive area 43b of the piezoelectric layer 43, according to the sputter method, the area not overlapping the diffusion-preventive layer 41 in a plane view so as to complete the piezoelectric actuator 32 (extraction electrode forming process). In addition, in the various electrode forming processes, the electrodes may not be necessarily formed by the sputter method, the electrodes may also be formed according to the screen printing method or the vapor deposition method.

Since the extraction electrodes 47 formed in the extraction electrode forming process are electrically in conduction with the high-conductive area 43b of the piezoelectric layer 43, it is thus also electrically in conduction with the vibration plate 40 and the common electrode 42 which are in conduction with the high-conductive area 43b. Thereby, the common electrode 42 is extracted onto the surface of the piezoelectric layer 43 by making the common electrode 42 be in conduction with the extraction electrodes 47 via the high-conductive area 43b.

An explanation will be made with respect to how great an influence may be brought on the change of the electrical resistance between the surfaces of the piezoelectric layer of the piezoelectric actuator (the electrical resistance of the piezoelectric layer in the thickness direction) before and after the annealing process with or without the diffusion-preventive layer. Further, in the annealing process, the piezoelectric layer 43 and the vibration plate 40 are heated at approximately 800° C. for two hours.

The diffusion-preventive layer 41 (1 µm in thickness) formed of alumina is arranged on the vibration plate 40 formed of an SUS430, the common electrode 42 (0.5 µm or less in thickness) formed of platinum is arranged on the upper surface of the diffusion-preventive layer 41, and the piezoelectric layer 43 (10 µm in thickness) formed of the piezoelectric material composed mainly of lead zirconate titanate is arranged on the upper surface of the common electrode 42. At this time, the electrical resistance between the surfaces of the piezoelectric layer is a few GΩ both before and after the annealing process. On the other hand, in the case of arranging a piezoelectric layer (10 µm in thickness) formed of the piezoelectric material composed mainly of lead zirconate titanate directly on a vibration plate formed of an SUS430, the electrical resistance between the surfaces of the piezoelectric layer is a few GΩ before the annealing process but approximately 500Ω after the annealing process. Therefore, it is understood that conductivity in the area of the piezoelectric layer in which the piezoelectric layer is in direct contact with the vibration plate is increased through heating the vibration plate and the piezoelectric layer in the annealing process. It is conceivable that because the metallic atoms of Fe, Cr, and the like which is included in the vibration plate diffuse to the piezoelectric layer, as a result, the conductivity in the area is increased.

According to the method for manufacturing the piezoelectric actuator 32 in accordance with the embodiment described above, it is possible to make the extraction electrodes 47 be in conduction with the common electrode 42 by increasing the conductivity of the area, of the piezoelectric layer 43, which is in contact with the vibration plate 40, through the heating process. Therefore, for example, it is not necessary to have a process of forming through holes penetrating the piezoelectric layer 43 in the thickness direction and filling the through holes with a conductor in order to make the common electrode 42 be in conduction with the extraction electrodes 47 on the surface of the piezoelectric layer 43. According to the method for manufacturing the piezoelectric actuator 32 in accordance with the embodiment, because the piezoelectric layer 43 and the vibration plate 40 are heated in the heating process for making the common electrode 42 be in conduction with the extraction electrodes 47, it is possible to simplify the manufacturing processes. Further, metallic materials are usually used as a conductor with which the through holes are filled. However, since it is not necessary to add a process of forming the through holes, the metallic materials are no longer needed, and thereby it is possible to reduce the cost.

Further, in the annealing process, the piezoelectric layer 43 is heated so as to improve the piezoelectric property of the piezoelectric layer 43. In addition, in the annealing process, the vibration plate 40 is also heated together with the piezoelectric layer 43 and thus the metallic atoms are diffused from the vibration plate 40 to the piezoelectric layer 43, thereby embracing a process of making the vibration plate 40, the common electrode 42, and the extraction electrodes 47 be in conduction with each other. Therefore, it is possible to further simplify the manufacturing processes so as to reduce man-hours.

Further, the extraction electrodes 47 are formed in the areas, on the upper surface of the high-conductive area 43b of the piezoelectric layer 43, which do not overlap the common electrode 42 in a plane view. Thereby, only the piezoelectric layer 43 is located between the vibration plate 40 and the extraction electrodes 47, but the common electrode 42 is not located therebetween. Therefore, in the heating process (annealing process), it is possible to reliably diffuse the metallic atoms of the vibration plate 40 to the piezoelectric layer 43 so as to further reliably make the vibration plate 40 be in conduction with the extraction electrodes 47.

In addition, in the individual electrode forming process, the individual electrodes 44 are formed such that the distance between an outer edge in the area, of the individual electrodes 44, in which the individual electrodes 44 overlap the common electrode 42 and an outer edge, of the diffusion-preventive layer 41, at which the distance from the outer edge of the individual electrodes 44 in a plane direction of the piezoelectric layer 43 is the shortest may become greater than the thickness of the piezoelectric layer 43. Thereby, it is possible to arrange the active portion at a position away from the outer edge of the diffusion-preventive layer 41 in the plane direction of the piezoelectric layer 43, a distance between the position and the outer edge of the diffusion-preventive layer 41 being greater than the thickness of the piezoelectric layer 43. Further, as shown in FIG. 6, the metallic atoms diffusing from the vibration plate 40 to the piezoelectric layer 43 do not diffuse only along a single direction (for example, the stacking direction) but diffuse radially. Therefore, although the piezoelectric layer 43 is covered with the diffusion-preventive layer 41, the diffused metallic atoms still reach, more or less, to the area of the piezoelectric layer 43 in the vicinity of the end portion of the diffusion-preventive layer 41, thereby degrading the piezoelectric property of the area. Here, as described above, the active portion of the piezoelectric layer 43 is arranged at the position away from the outer edge of the diffusion-preventive layer 41, the distance between the position and the outer edge of the diffusion-preventive layer 41 being greater than the thickness of the piezoelectric layer 43. Therefore, the metallic atoms are prevented from diffusing to the active portion of the piezoelectric layer 43. As a result, it is possible to prevent the piezoelectric property from degradation in the active portion.

Further, since the high-conductive area 43b of the piezoelectric layer 43 is formed by diffusing the metallic atoms of the vibration plate 40, the high-conductive area 43b of the piezoelectric layer 43 is inevitably in conduction with the vibration plate 40. Thereby, the vibration plate 40 is also in conduction with the extraction electrodes 47 and the common electrode 42. Supposedly, if the plurality of individual electrodes 44 were in conduction with the vibration plate 40, all the individual electrodes 44 would come to be at the same potential, and the like, thereby bringing an influence on driving the piezoelectric actuator 32. However, in this embodiment, it is the common electrode 42 that is in conduction with the vibration plate 40, and the common electrode 42 is constantly kept at the ground potential. Therefore, even though the vibration plate 40 is in conduction with the extraction electrodes 47 and the common electrode 42, no influence will be brought on driving the piezoelectric actuator 32.

Second Embodiment

Next, explanations will be made with respect to a second embodiment. The second embodiment is different from the first embodiment regarding the area of forming the common electrode, that is, regarding the common electrode forming process, but is the same as the first embodiment in other configurations. The constitutive parts or components, which are the same as or equivalent to those of the first embodiment, are designated by the same reference numerals, any explanation of which will be omitted.

Figure 8:
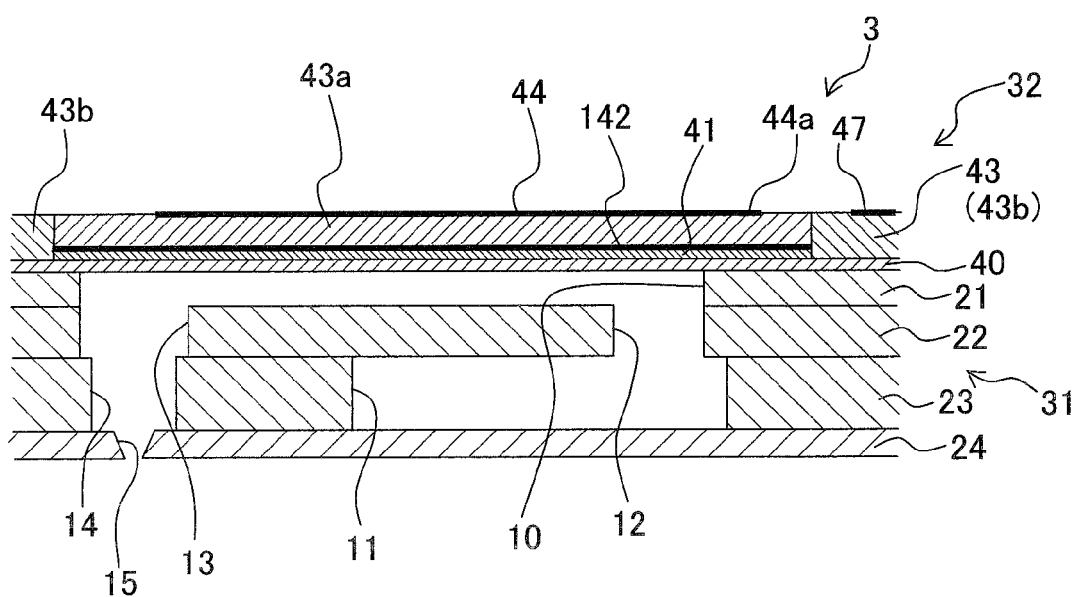
FIG. 8 is a longitudinal sectional view of an ink-jethead in accordance with the second embodiment.

As shown in FIG. 8, in the common electrode forming process, a common electrode 142 is not formed on the upper surface of the vibration plate 40, but only formed across the entire area on the upper surface of the diffusion-preventive layer 41, that is, the common electrode 142 is formed within the outer edges of the diffusion-preventive layer 41. At this time, the end face of the common electrode 142 is in contact with the end face of the high-conductive area 43b of the piezoelectric layer 43. Further, the high-conductive area 43b is in conduction with the extraction electrodes 47. Therefore, the common electrode 142 is in conduction with the extraction electrodes 47 via the high-conductive area 43b. In this manner, it is possible to make the common electrode 142 be in conduction with the extraction electrodes 47 although the common electrode 142 is not directly contacted with the vibration plate 40.

Therefore, in the same manner as the first embodiment, it is not necessary to have a process of forming through holes in order to connect the common electrode 142 to the extraction electrodes 47 located on the surface of the piezoelectric layer 43, but sufficient to carry out a heating process of heating the piezoelectric layer 43 and the vibration plate 40. Thereby, it is possible to simplify the manufacturing processes. Further, since it is not necessary to have the process of forming through holes, it is not necessary to prepare metallic materials for filling the through holes. Thereby, it is possible to reduce the cost. Further, the common electrode 142 is not necessarily formed to cover the entire area on the upper surface of the diffusion-preventive layer 41, as long as at least a part of the common electrode 142 is arranged along the outer edges of the diffusion-preventive layer 41.

Next, explanations will be made with respect to modifications in which various changes are applied to the embodiments. However, it should be appreciated that the constitutive parts or components, which are the same as or equivalent to those of the embodiments as described above, are designated by the same reference numerals, any explanation of which will be omitted.

In the embodiments, as a piezoelectric layer forming process, the piezoelectric layer 43 is formed according to the AD method. However, it may also be formed according to a sol-gel method. Then, it is necessary to have a process of heating the piezoelectric layer 43 and the vibration plate 40 at a temperature from 600° C. to 700° C. in order to volatilize the solvent in the gel. This process corresponds to the heating process in accordance with the present teaching. Further, in this heating process, the metallic atoms of the vibration plate 40 are diffused to the piezoelectric layer 43 to form the high-conductive area 43b in the piezoelectric layer 43, and thereby the common electrode 42 is in conduction with the extraction electrodes 47. Therefore, in the same manner as according to the AD method, it is possible to further simplify the manufacturing processes and thus reduce the man-hours.

Further, in the piezoelectric layer forming process, the piezoelectric layer 43 may be formed according to film forming methods, other than the AD method and the sol-gel method, such as a sputter method, a chemical vapor deposition method, a hydrothermal synthesis method and the like. Then, it is necessary to have a heating process of heating the piezoelectric layer 43 and the vibration plate 40 at a temperature or above at which the metallic atoms of the vibration plate 40 diffuse (approximately 600° C. or higher) so as to diffuse the metallic atoms of the vibration plate 40. Then, the conductivity in the area of the piezoelectric layer 43 in which the diffusion-preventive layer 41 is not formed is increased so that the both surfaces of the area are in conduction with each other.

Further, in the embodiments, as shown in FIG. 4, the common electrode 42 is formed to cover the entire area on the upper surface of the diffusion-preventive layer 41 and, further, is formed on a part of the upper surface of the vibration plate 40 beyond the outer edges of the diffusion-preventive layer 41. However, the present teaching is not limited to this, and the common electrode 42 may also be formed to cover the entire area on the upper surface of the vibration plate 40 irrespective of existence or nonexistence of the diffusion-preventive layer 41. That is, the common electrode 42 may also be formed between the vibration plate 40 and the piezoelectric layer 43. Then, the common electrode 42 is formed to cover the entire surface on the vibration plate 40. Therefore, it is possible to form the common electrode easily, since there is no need to perform patterning for forming the common electrode.

Further, in the embodiments, after the piezoelectric layer forming process is carried out, the annealing process is carried out, and then the individual electrode forming process and the extraction electrode forming process are carried out. However, after the piezoelectric layer forming process is carried out, the annealing process, and the individual electrode forming process and the extraction electrode forming process may also be carried out in any sequence.

Further, in the embodiments, the extraction electrodes 47 are formed on the upper surface of the piezoelectric layer 43 only at the areas which do not overlap the diffusion-preventive layer 41 in a plane view. However, the extraction electrodes may also be formed even in areas, on the upper surface of the piezoelectric layer 43, which overlap with the diffusion-preventive layer 41, as long as the extraction electrodes are not in conduction with the individual electrodes 44.

Figure 9A:
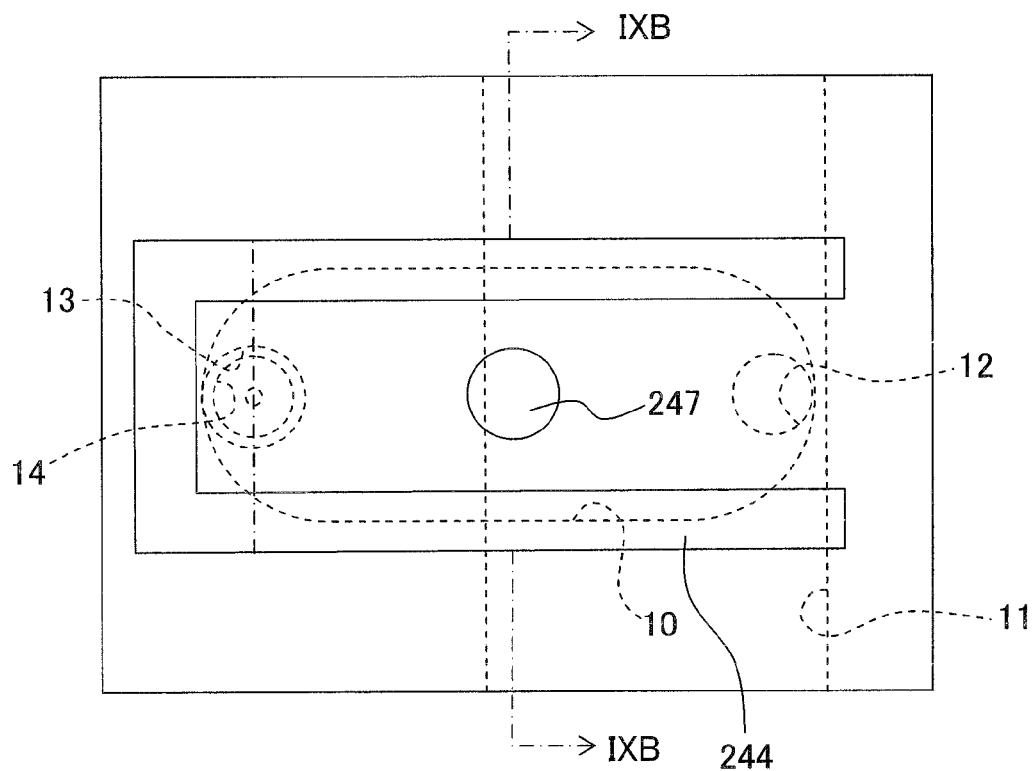
FIGS. 9A and 9B constitute a diagram of an ink-jet head in accordance with a modification.
Figure 9B:
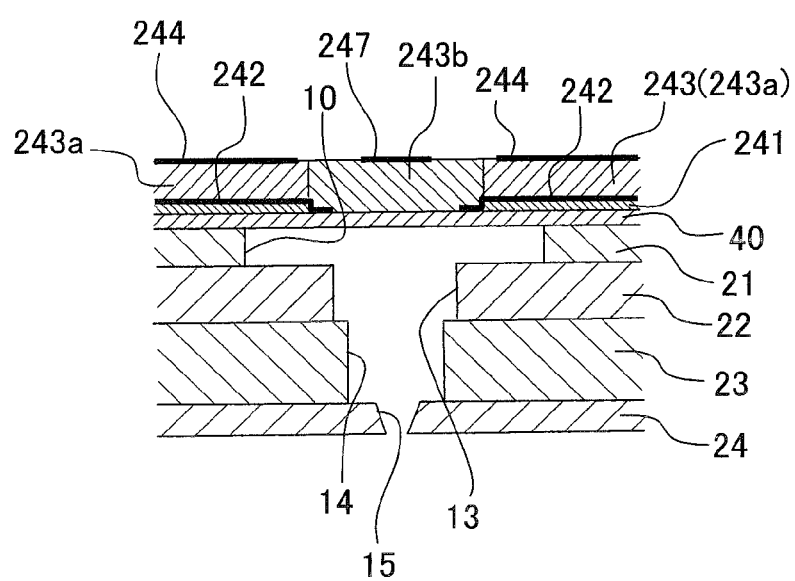

Further, in the embodiments, as shown in FIGS. 3 and 4, the individual electrodes 44 are arranged on the upper surface of the piezoelectric layer 43 at the areas which overlap with the approximate centers of the pressure chambers 10 in a plane view, respectively, and the extraction electrodes 47 are arranged on the upper surface of the piezoelectric layer 43 at the areas which do not overlap the pressure chambers 10 in a plane view. However, the present teaching is not limited to this, and the individual electrodes 44 may not be necessarily formed on the upper surface of the piezoelectric layer 43 at the areas which overlap the approximate centers of the pressure chambers 10 in a plane view, respectively. For example, as shown in FIGS. 9A and 9B, the substantially U-shaped individual electrodes 244 may also be formed on the upper surface of the piezoelectric layer 43 to surround the areas which overlap the approximate centers of the pressure chambers 10 in a plane view. That is, each of the individual electrodes 244 may be arranged on the upper surface of the piezoelectric layer 43 at the areas which overlap with the two end portions of one of the pressure chambers 10 in the width direction, such that each of the individual electrodes 244 has two extending portions formed on the areas to extend in the longitudinal direction of the pressure chambers 10, the two extending portions being connected with each other at one of the end portions of the one of the pressure chambers 10 in the longitudinal direction. Then, the extraction electrodes 247 may also be arranged on the piezoelectric layer 43 at the positions which overlap the pressure chambers 10 in a plane view. At this time, a diffusion-preventive layer 241 is formed to cover the area which overlaps with the individual electrodes 244 in a plane view. The method for driving a piezoelectric actuator according to this configuration is as follows: when a drive potential is applied to a certain individual electrode 244, the area of the piezoelectric layer 43 which overlap the individual electrode 244 contract in a horizontal direction. That is, the piezoelectric layer 43 contracts in a horizontal direction at the area which overlaps with the two end portions of the pressure chamber 10 in the width direction. By virtue of this contraction of the piezoelectric layer 43, the portions of the vibration plate 40, the diffusion-preventive layer 241, a common electrode 242, and the piezoelectric layer 43 which overlap with the pressure chamber 10 deform to be convex toward the opposite side of the pressure chamber 10. Thereafter, when the individual electrode 244 is changed to the ground potential, the deformation is released, and the ink is thus discharged from the nozzle 15 in communication with the pressure chamber 10.

Figure 10:
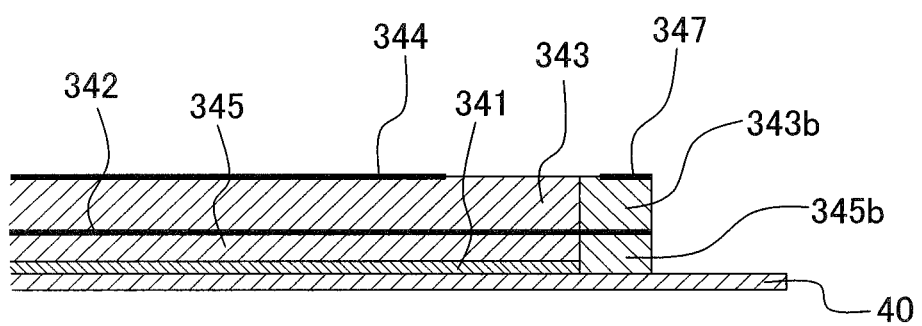
FIG. 10 is a longitudinal sectional view of a piezoelectric actuator in accordance with another modification.

Further, when the piezoelectric layer 43 and the vibration plate 40 are heated in the annealing process, a thermal stress may be generated in the piezoelectric layer 43 due to the difference in coefficient of thermal expansion between the piezoelectric layer 43 and the vibration plate 40, thereby degrading the piezoelectric property of the piezoelectric layer 43. In order to prevent this, an intermediate layer may also be arranged between the vibration plate 40 and the piezoelectric layer 43 to function as a stress relaxation layer. Further, in order to improve the adhesion between the vibration plate 40 and the common electrode 42, an intermediate layer may also be arranged between the vibration plate 40 and the common electrode 42 to function as an adhesion layer. Alternatively, an intermediate layer may also be arranged to function not only as a stress relaxation layer but also as an adhesion layer. For example, in the piezoelectric actuator as shown in FIG. 10, two piezoelectric layers 343 and 345 are arranged on the upper surface of the vibration plate 40, a diffusion-preventive layer 341 is arranged between the vibration plate 40 and the lower piezoelectric layer 345, a common electrode 342 is arranged between the two piezoelectric layers 343 and 345, and individual electrodes 344 and extraction electrodes 347 are arranged on the upper surface of the upper piezoelectric layer 343. Supposedly, if the common electrode 342 formed of a metal is formed directly on the upper surface of the diffusion-preventive layer 341 formed of ceramics, a thermal stress would be generated due to the difference in linear expansion coefficient, thereby resulting in an easy detachment of the common electrode 342 from the diffusion-preventive layer 341. Nevertheless, in the above example, the lower piezoelectric layer 345 is arranged between the diffusion-preventive layer 341 and the common electrode 342. Accordingly, the lower piezoelectric layer 345 is arranged as an intermediate layer formed of a material with an intermediate linear expansion coefficient between the metal and the ceramics. Therefore, it is possible to restrain the thermal stress from occurrence due to the difference in linear expansion coefficient so as to restrain the easy detachment of the common electrode 342 from the diffusion-preventive layer 341.

Further, when the vibration plate and the channel unit become charged, the ink to be jetted may not fly straight. Therefore, in the conventional technology, the vibration plate and the channel unit are conducted with the common electrode to be kept at the ground potential. In this case, according to the conventional configuration, when a piezoelectric layer as an intermediate layer lies between a common electrode and a vibration plate, the piezoelectric layer as the intermediate layer insulates the common electrode from the vibration plate. Therefore, conductive paste was applied to the upper surface of the vibration plate and to the end face of the two piezoelectric layers so as to make the vibration plate be in conduction with the common electrode. However, in the modification as described above, since the metallic atoms of the vibration plate 40 diffuse to the two piezoelectric layers 343 and 345 in the heating process, the areas of the two piezoelectric layers 343 and 345 which do not overlap with the diffusion-preventive layer 341 in a plane view become high-conductive areas 343b and 345b. Therefore, it is possible to make the vibration plate 40 be in conduction with the common electrode 342 without the need of conductive paste. Further, in such processes of manufacturing a piezoelectric actuator, since it is not necessary to have a process of preparing conductive paste, it is possible to simplify the processes. Further, the upper surface of the vibration plate 40 may not be necessarily conducted with the end face of the two piezoelectric layers 343 and 345, and it is possible to make the vibration plate 40 be in conduction with the common electrode 342 at any position.

Further, in the embodiments and modifications as described above, the diffusion-preventive layer is formed of ceramics such as alumina, zirconia, and the like. However, the present teaching is not limited to this. The diffusion-preventive layer may also be formed of materials, which have a dense structure, by which the metallic atoms of the vibration plate are prevented from diffusing to the piezoelectric layer, and atoms (particles) of which hardly diffuse. For example, the diffusion-preventive layer may also be formed of a diffusion suppressed metal, atoms of which hardly diffuse, such as Au, Pt, and the like. When the diffusion-preventive layer is formed of the metallic material such as Au, Pt, and the like, the diffusion-preventive layer may also double as the common electrode. In this case, the common electrode forming process as described above is able to double as the diffusion-preventive layer forming process, thereby making it possible to further simplify the manufacturing processes. Further, when the common electrode doubles as the diffusion-preventive layer, the common electrode may be formed thicker than the case of forming the common electrode on the diffusion-preventive layer. For example, the common electrode having 1 μm or more thickness may also be formed.

In the embodiments and the modifications as described above, the present teaching is applied to a method for manufacturing a piezoelectric actuator and to the piezoelectric actuator which is utilized in the ink-jethead for recording an image and the like by discharging ink to the recording paper P. However, the present teaching is not limited to application to such a piezoelectric actuator as utilized in the ink-jethead but applicable to methods for manufacturing piezoelectric actuators and to the piezoelectric actuators per se utilized in various purposes.

What is claimed is:

1. A method for manufacturing a piezoelectric actuator, comprising:
    preparing a vibration plate formed of a metal;
    forming a diffusion-preventive layer on a surface of the vibration plate, a part of a surface of the diffusion-preventive layer not facing the vibration plate having an electrical conductivity;
    forming a piezoelectric layer in a first area, of the surface of the vibration plate, in which the diffusion-preventive layer is formed and in a second area, of the surface of the vibration plate, in which the diffusion-preventive layer is not formed;
    forming an electrode in a third area, of a surface of the piezoelectric layer not facing the vibration plate, which overlaps with the part of the surface of the diffusion-preventive layer;
    forming an extraction electrode in a fourth area, of the surface of the piezoelectric layer, which does not overlap with the diffusion-preventive layer; and
    heating the piezoelectric layer and the vibration plate so as to diffuse metallic atoms in the vibration plate to the piezoelectric layer, after the piezoelectric layer is formed,
    wherein in the heating of the piezoelectric layer and the vibration plate, the metallic atoms in the vibration plate are diffused to the piezoelectric layer such that a portion of the surface of the piezoelectric layer, which is located in the fourth area and which is in contact with the vibration plate is electrically conducted with the surface of the vibration plate so as to make the part of the surface of the diffusion-preventive layer be in conduction with the extraction electrode,
    in the forming of the diffusion-preventive layer, a diffusion-preventive film having an insulation property is formed on the surface of the vibration plate, and a first electrode is formed to cover both a surface of the diffusion-preventive film not facing the vibration plate and the surface of the vibration plate;
    in the forming of the extraction electrode, the extraction electrode is formed in an area, of the surface of the piezoelectric layer not facing the vibration plate, which does not overlap with the diffusion-preventive film, and
    in the heating of the piezoelectric layer and the vibration plate, the first electrode is conducted with the extraction electrode.

2. The method according to claim 1, wherein in the forming of the piezoelectric layer, the piezoelectric layer is formed according to an aerosol deposition method; and
    in the heating of the piezoelectric layer and the vibration plate, the piezoelectric layer and the vibration plate are heated at a temperature at which an annealing of the piezoelectric layer is performed.

3. The method according to claim 1, wherein in the forming of the piezoelectric layer, the piezoelectric layer is formed according to a sol-gel method, and
    in the heating of the piezoelectric layer and the vibration plate, the piezoelectric layer and the vibration plate are heated at a temperature at which a solvent in a gel is removed.

4. The method according to claim 1, wherein in the forming of the extraction electrode, the extraction electrode is formed in an area, of the surface of the piezoelectric layer not facing the vibration plate, which does not overlap with the first electrode.

5. The method according to claim 1, wherein in the forming of the electrode, a plurality of the electrodes are formed, on the surface of the piezoelectric layer not facing the vibration plate, separately in a plane direction; and the part of the surface of the diffusion-preventive layer faces the electrodes.

6. The method according to claim 1, wherein in the forming of the diffusion-preventive film, the diffusion-preventive film is formed such that a distance from an edge portion of an area in which the first electrode faces the electrode to an outer edge of the diffusion-preventive film is longer than a thickness of the piezoelectric layer.

7. The method according to claim 1, wherein the metal forming the vibration plate includes Fe or Cr.

8. The method according to claim 1, wherein in the forming of the diffusion-preventive layer, a ceramic diffusion-preventive film is formed on the surface of the vibration plate, and a conductive electrode portion is formed on a part of a surface of the diffusion-preventive film not facing the vibration plate.

9. The method according to claim 1, wherein the diffusion-preventive layer is formed of a thin film of Au or Pt.

10. The method according to claim 1, wherein in the forming of the diffusion-preventive layer, a ceramic diffusion-preventive film is formed on the surface of the vibration plate; a piezoelectric layer is formed as an intermediate layer on a surface, of the diffusion-preventive film, not facing the vibration plate; and a metallic electrode portion is formed on a surface, of the intermediate layer, not facing the diffusion-preventive film,
    a linear expansion coefficient of the intermediate layer is between a linear expansion coefficient of the diffusion-preventive film and a linear expansion coefficient of the electrode portion.

11. A method for manufacturing a piezoelectric actuator, comprising:
    preparing a vibration plate formed of a metal;
    forming a diffusion-preventive layer on a surface of the vibration plate, a part of a surface of the diffusion-preventive layer not facing the vibration plate having an electrical conductivity;
    forming a piezoelectric layer in a first area, of the surface of the vibration plate, in which the diffusion-preventive layer is formed and in a second area, of the surface of the vibration plate, in which the diffusion-preventive layer is not formed;
    forming an electrode in a third area, of a surface of the piezoelectric layer not facing the vibration plate, which overlaps with the part of the surface of the diffusion-preventive layer;
    forming an extraction electrode in a fourth area, of the surface of the piezoelectric layer, which does not overlap with the diffusion-preventive layer; and
    heating the piezoelectric layer and the vibration plate so as to diffuse metallic atoms in the vibration plate to the piezoelectric layer, after the piezoelectric layer is formed,
    wherein in the heating of the piezoelectric layer and the vibration plate, the metallic atoms in the vibration plate are diffused to the piezoelectric layer such that a portion of the surface of the piezoelectric layer, which is located in the fourth area and which is in contact with the vibration plate is electrically conducted with the surface of the vibration plate so as to make the part of the surface of the diffusion-preventive layer be in conduction with the extraction electrode, in the forming of the diffusion-preventive layer, a diffusion-preventive film having an insulation property is formed on the surface of the vibration plate, and a first electrode is formed on a surface of the diffusion-preventive film not facing the vibration plate such that the first electrode has an end face along a part of an outer edge of the diffusion-preventive film, in the forming of the extraction electrode, the extraction electrode is formed in an area, of the surface of the piezoelectric layer, which does not overlap with the diffusion-preventive film, and in the heating of the piezoelectric layer and the vibration plate, the first electrode is conducted with the extraction electrode.

12. The method according to claim 11, wherein in the forming of the extraction electrode, the extraction electrode is formed in an area, of the surface of the piezoelectric layer not facing the vibration plate, which does not overlap with the first electrode.

13. The method according to claim 11, wherein in the forming of the diffusion-preventive film, the diffusion-preventive film is formed such that a distance from the edge portion of an area in which the first electrode faces the electrode to an outer edge of the diffusion-preventive film is longer than a thickness of the piezoelectric layer.

* * * * *